United States Patent
Wang et al.

(10) Patent No.: US 10,270,434 B2
(45) Date of Patent: Apr. 23, 2019

(54) POWER SAVING WITH DYNAMIC PULSE INSERTION

(71) Applicant: Apple Inc., Cupertino, CA (US)

(72) Inventors: James Wang, Vista, CA (US);
Benjiman L. Goodman, Cedar Park, TX (US); Liang-Kai Wang, Austin, TX (US); Robert D. Kenney, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/046,926

(22) Filed: Feb. 18, 2016

(65) Prior Publication Data

US 2017/0244391 A1  Aug. 24, 2017

(51) Int. Cl.
| | |
|---|---|
| H03K 3/00 | (2006.01) |
| H03K 5/00 | (2006.01) |
| G06F 1/3228 | (2019.01) |
| G06F 1/324 | (2019.01) |
| G06F 1/329 | (2019.01) |

(52) U.S. Cl.
CPC ......... *H03K 5/00006* (2013.01); *G06F 1/324* (2013.01); *G06F 1/329* (2013.01); *G06F 1/3228* (2013.01)

(58) Field of Classification Search
CPC ...... G06F 1/3203; G06F 1/324; G06F 1/3237; G06F 1/10; G06F 1/3287; G06F 1/329
See application file for complete search history.

(56) References Cited

U.S. PATENT DOCUMENTS

| | | | |
|---|---|---|---|
| 7,958,483 B1 | 6/2011 | Alben et al. | |
| 8,671,380 B2 | 3/2014 | Wang et al. | |
| 8,769,332 B2 | 7/2014 | Ziesler et al. | |
| 2005/0216775 A1* | 9/2005 | Inoue | G06F 1/206 713/300 |
| 2008/0069115 A1* | 3/2008 | Jensen | H04L 47/24 370/395.41 |
| 2013/0021072 A1* | 1/2013 | Wang | G06F 1/08 327/145 |
| 2013/0191677 A1* | 7/2013 | Ziesler | G06F 1/3237 713/500 |
| 2014/0006632 A1* | 1/2014 | Evens | H04L 65/605 709/227 |
| 2015/0095010 A1* | 4/2015 | Brock | G06F 17/5009 703/21 |
| 2015/0370304 A1 | 12/2015 | Abu Salah et al. | |

* cited by examiner

*Primary Examiner* — Jaweed A Abbaszadeh
*Assistant Examiner* — Alyaa T Mazyad
(74) *Attorney, Agent, or Firm* — Meyertons, Hood, Kivlin, Kowert & Goetzel, P.C.; Erik A. Heter

(57) ABSTRACT

A method and apparatus for saving power in integrated circuits is disclosed. An IC includes functional circuit blocks which are not placed into a sleep mode when idle. A power management circuit may monitor the activity levels of the functional circuit blocks not placed into a sleep mode. When the power management circuit detects that an activity level of one of the non-sleep functional circuit blocks is less than a predefined threshold, it reduce the frequency of a clock signal provided thereto by scheduling only one pulse of a clock signal for every N pulses of the full frequency clock signal. The remaining N-1 pulses of the clock signal may be inhibited. If a high priority transaction inbound for the functional circuit block is detected, an inserted pulse of the clock signal may be provided to the functional unit irrespective of when a most recent regular pulse was provided.

18 Claims, 4 Drawing Sheets

POWER SAVING WITH DYNAMIC PULSE INSERTION

BACKGROUND

Technical Field

This disclosure is directed to electronic circuits, and more particularly, a method and apparatus for balancing processing workloads in electronic circuits.

Description of the Related Art

Power consumption in integrated circuits (ICs) is an important design consideration. Minimizing power consumption in an IC can reduce the thermal output from a corresponding electronic device, and can also preserve battery life for mobile devices. Accordingly, many ICs include various types of circuitry dedicated to monitoring activity levels in various functional circuits implemented thereon. When such functional circuits are determined to be idle, they may be placed into a sleep state, thereby reducing the overall power consumption of the IC.

Although it is desirable to reduce power consumption in idle functional circuit blocks, placing them in a sleep state does require some overhead. For example, in a processing circuit, a current state may need to be saved before placing it in the sleep state. This may include copying the states of registers and other internal memories, as well as saving status information regarding other circuits (e.g., schedulers, etc.). This can consume time both when entering the sleep state as well as exiting. In some cases, certain functional circuitry may need to be able to quickly respond to inbound transaction, requests, and so forth. If the performance hit incurred due to entering and exiting a sleep state is deemed to be unacceptable, such functional circuits may not be placed into a sleep state, and may continue to remain in an active state.

SUMMARY

A method and apparatus for saving power in integrated circuits is disclosed. In one embodiment, an integrated circuit (IC) includes a number of functional circuit blocks, some of which are not placed into a sleep mode when idle. A power management circuit may monitor the activity levels of at least some of the functional circuit blocks, including some not placed into a sleep mode. When the power management circuit detects that an activity level is less than a predefined threshold, it may reduce the frequency of a clock signal provided thereto. Reducing the frequency of the clock signal may be accomplished by scheduling only one pulse of a clock signal for every N pulses of the full frequency clock signal. The remaining N−1 pulses of the clock signal may be inhibited. However, if it is detected that a high priority transaction is inbound for the functional unit, an inserted pulse of the clock signal may be provided to the functional unit irrespective of when a most recent regular pulse was provided. In this manner, the functional circuit block may respond to high priority transactions.

In one embodiment, a clock signal may be provided to a functional circuit block via a clock gating circuit. The power management circuit may reduce the frequency of a clock signal output from the clock gating circuit (an 'operating clock signal') by gating a clock signal input thereto (an 'source clock signal'). The power management circuit may cause N−1 pulses of the operating clock signal to be inhibited for every N pulses of the source clock signal. This effectively reduces the frequency of the operating clock signal to 1/N of the source clock signal. Each pulse of the operating clock signal may be defined herein as a 'scheduled' pulse. When certain high priority transactions or other events occur in which the functional circuit block is to respond to without delay, the power management circuit may cause the clock gating circuit to output another pulse that may be outside of the time frame of the regular pulses. This may be referred to as an inserted pulse, and may occur irrespective of when the most recently regular pulse occurred. After an inserted pulse is provided from the clock gating circuit, the power management circuit may re-adjust the sequence so that the next N−1 pulses of the operating clock are inhibited unless another high priority transaction is received.

BRIEF DESCRIPTION OF THE DRAWINGS

The following detailed description makes reference to the accompanying drawings, which are now briefly described.

Figure 1:
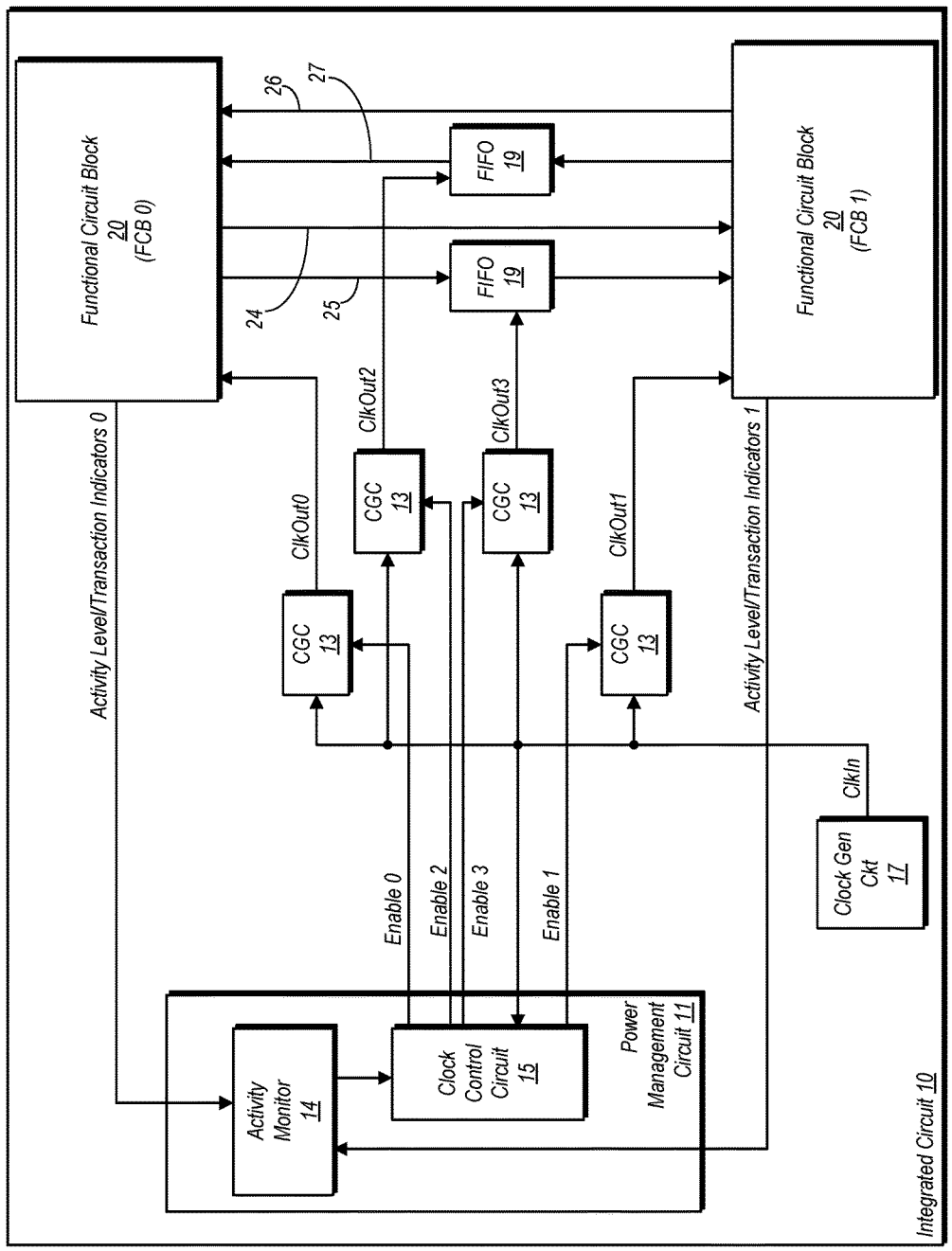
FIG. 1 is block diagram of one embodiment of an IC.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities rich may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. An "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a block diagram of one embodiment of an integrated circuit (IC) is shown. It is noted that the embodiment of IC 10 shown here is exemplary, and is provided for illustrative purposes. Furthermore, IC 10 is shown here in a simplified form, although significantly more complex embodiments are possible and contemplated while falling within the scope of this disclosure. Thus, embodiments of an IC falling within the scope of this disclosure may include functional circuit block with different operating characteristics than those shown here. Similarly, embodiments that include power management circuits that perform functions in addition to those discussed herein are also possible and contemplated.

IC 10 includes a pair of functional circuit blocks 20, also labeled as functional circuit block (FCB) 0 and FCB 1. Each of these functional circuit blocks may be operated such that they remain active throughout the operation of IC 10, i.e. neither is placed into a sleep mode as long as IC 10 is operating. IC 10 may include other functional circuit blocks 10 that may be placed into a sleep mode when certain conditions are met (e.g., idle in operation, no inbound transactions). However, the two FCBs 20 shown here may perform at least some critical functions for which it is desirable to handle in a timely manner, and/or may require an undesirable amount of overhead to place into a sleep mode. Accordingly, the FCBs 20 shown in FIG. 1 are not placed into a sleep mode when IC 10 is operation.

Since power savings is desirable, one of the ways in which it can be achieved in the FCBs 20 shown here is to reduce the frequency of the respectively received clock signals. In this embodiment, FCB 0 is coupled to receive a first clock signal, ClkOut0, while FCB 1 is coupled to receive a second clock signal, ClkOut1. These clock signals are received from respectively coupled clock gating circuits (CGCs) 13. Each instance of CGC 13 shown in this embodiment is coupled to receive a source clock signal, ClkIn, from a clock generation circuit 17. The CGCs 13 may be implemented using any suitable clock gating circuit topology. Clock control circuit 15, in power management circuit 11, may control the frequency of each of ClkOut0 and ClkOut1 by selectively asserting and de-asserting the Enable 0 and Enable 1 signals, respectively. In this embodiment, clock control circuit may reduce the frequency of a given one Clk0 and Clk1 to 1/N of its full value, wherein N is an integer value. To perform the frequency reduction, the respective enable signal may be asserted for one of every N cycles, or pulses, of the source clock signal, ClkIn, and de-asserted for the remaining N−1 pulses. As used herein, the operating clock pulse provided when a respective enable signal is asserted may be referred to as a schedule pulse. The outputting of only one of every N pulses of the source clock signal from a CGC 13 effectively reduces the operating frequency of the corresponding operating clock signal.

Power management circuit 11 in the embodiment shown includes an activity monitor 14, which may be implemented using hardware/circuitry, software, or a combination thereof. Activity monitor 14 may monitor the activity levels of the functional circuit blocks shown here, and may determine when their respective clock frequencies may be reduced. To accomplish this, activity monitor 14 may compare various activity indications to one or more thresholds. For example, one or more of FCB 20 shown herein may be processing circuits that execute a number of threads. The activity monitor 14 may compare a number of active threads on the corresponding FCB 20 to a threshold value. If the number of active threads is less than a threshold value, activity monitor 14 may provide an indication to clock control circuit 15 that the corresponding FCB 20 is in a low activity state. In another example, activity monitor may determine the presence of one or more long latency transactions initiated by a FCB 20. If such transactions have been initiated and it is determined that the response time for such transactions will be longer than a predetermined time threshold, activity monitor 14 may indicate to clock control circuit 15 that the corresponding FCB 20 is in a low activity state since it is essentially waiting for the long latency transactions to return information.

Generally speaking, activity monitor 14 may use any suitable metric(s) for determining that a reporting FCB 20 is in a low activity state. Other possibilities include instructions executed per cycle, instructions scheduled, transactions initiated/received within a given time period, and so forth. The metrics used may be specific to the type of circuitry implemented by a given FCB 20. For example, a general purpose processing circuit may use one type of metric, while a graphics processing core may use other types of metrics.

Responsive to receiving a low activity indication from activity monitor 14 indication, clock control circuit 15 may begin a pattern of asserting and de-asserting the respective enable signal provided to a corresponding CGC 13, thereby causing an effective reduction in the frequency of the corresponding operating clock signal.

In the embodiment shown, FCB 0 is coupled to communicate with FCB 1. Both of the FCBs may transmit and receive information from the other as shown here. FCB 0 may convey information to FCB 1 via signal path 24 or signal path 25. Signal path 24 may be reserved for conveying high priority transactions from FCB 0 to FCB 1, while signal path 25 may be used for conveying non-high priority transactions. Similarly, signal path 27 may be reserved for high priority transactions conveyed from FCB 1 to FCB 0, while signal path 26 may be used for conveying non-high priority transactions. A high priority transaction may be defined herein as a transaction or information that is latency critical and is to be handled by the receiving FCB with as little delay as possible. A non-high priority transaction may be one that is not latency critical or otherwise has latency requirements that are not as strict as high priority transactions.

Since high priority transactions have stricter latency requirements, IC 10 as shown herein is arranged to allow for their handling in a timely manner when operating at a reduced clock frequency. In particular, each FCB 20 may indicate to activity monitor when it is about to initiate a high-priority transaction. Responsive to receiving an indication of a high priority transaction, activity monitor may provide an indication of the same to clock control unit 15. Responsive thereto, clock control unit 15 may cause a pulse of the operating clock signal to be inserted even if the pulse is otherwise an inserted pulse (i.e. occurs within the timeframe of the N−1 operating clock pulses that are usually inhibited during operation at the reduced clock frequency). The inserted pulse may be provided responsive to an assertion of an enable signal to a corresponding CGC 13. For example, clock control unit 15 may assert the Enable 0 signal to allow an inserted pulse of ClkOut 0 to be provided to FCB 0 responsive to a high priority transaction being conveyed thereto. This allows FCB 0 to receive the transaction within the stricter latency requirements while still allowing operation at the reduced clock frequency.

When a pulse is inserted due to a high priority transaction during reduced frequency operation, the timing of the clock pulses may be reset. In particular, after an inserted pulse, the immediately subsequent N−1 pulses may be inhibited unless another high priority transaction occurs. In the event that no further high priority transactions occur after the inserted pulse, the next regular pulse occurs after the immediate subsequent N−1 pulses have been inhibited. In this manner, operation in the reduced frequency mode is maintained. Clock control unit 15 may include various circuits to control when the enable signals are toggled to allow pulses of the various operating clock signals to propagate when operating at the reduced clock frequency. For example, clock control unit 15 may include counters that are reset each time an inserted pulse is inserted. Additional logic may be provided to cause the next regular pulse to be provided from given CGC 13 after the immediately following N−1 operating clock pulses are inhibited following an inserted pulse. Additional aspects of the timing of pulses is shown in FIG. 2.

In each of signal paths 25 and 27, a first-in first-out memory (FIFO) 19 is present. Each of the FIFOs 19 may receive and provide temporary storage for non-high priority transactions. Each of the FIFOs 19 is coupled to receive a corresponding operating clock signal (ClkOut2 or ClkOut3) from a corresponding CGC 13. When a receiving FCB 20 is operating at a reduced clock frequency as described above, the FIFO 19 coupled to provide transaction to the FCB 20 may also operate in the reduced frequency mode. It is noted that FIFOs 19 shown herein provided transactions to a correspondingly coupled FCB 20 only on scheduled clock pulses. Accordingly, clock control circuit 15 in the embodiment shown includes logic to ensure that each FIFO 19 only receives regular pulses from its respective CGC 13, irrespective of when the most recent previous regular pulse was received. However, various mechanisms may also be implemented to prevent an overflow condition in the FIFOs 19. For example, the FCBs 20 may be arranged to conduct handshaking operations to ensure that there is sufficient room in the FIFOs for a next transaction to be received and temporarily stored. Alternatively, additional logic may be associated with each of the FIFOs 19 that communicates with the FCB 20 from which transactions are received. Such logic may provide an indication that its respective FIFO 19 is full, and thus cause a corresponding FCB 20 to delay transmitting a transaction thereto.

Activity monitor 14 may continue monitoring the activity levels of the FCBs 20 even when they are operating at the reduced clock frequency. Should their respective activity levels increase to about the threshold(s) against which they are compared, activity monitor 14 may indicate the same to clock control circuit 15. Thereafter, clock control circuit 15 may hold the corresponding enable signals in an asserted state, thereby allowing their associated operating clock signals to be provided at the full operational frequency.

Figure 2:
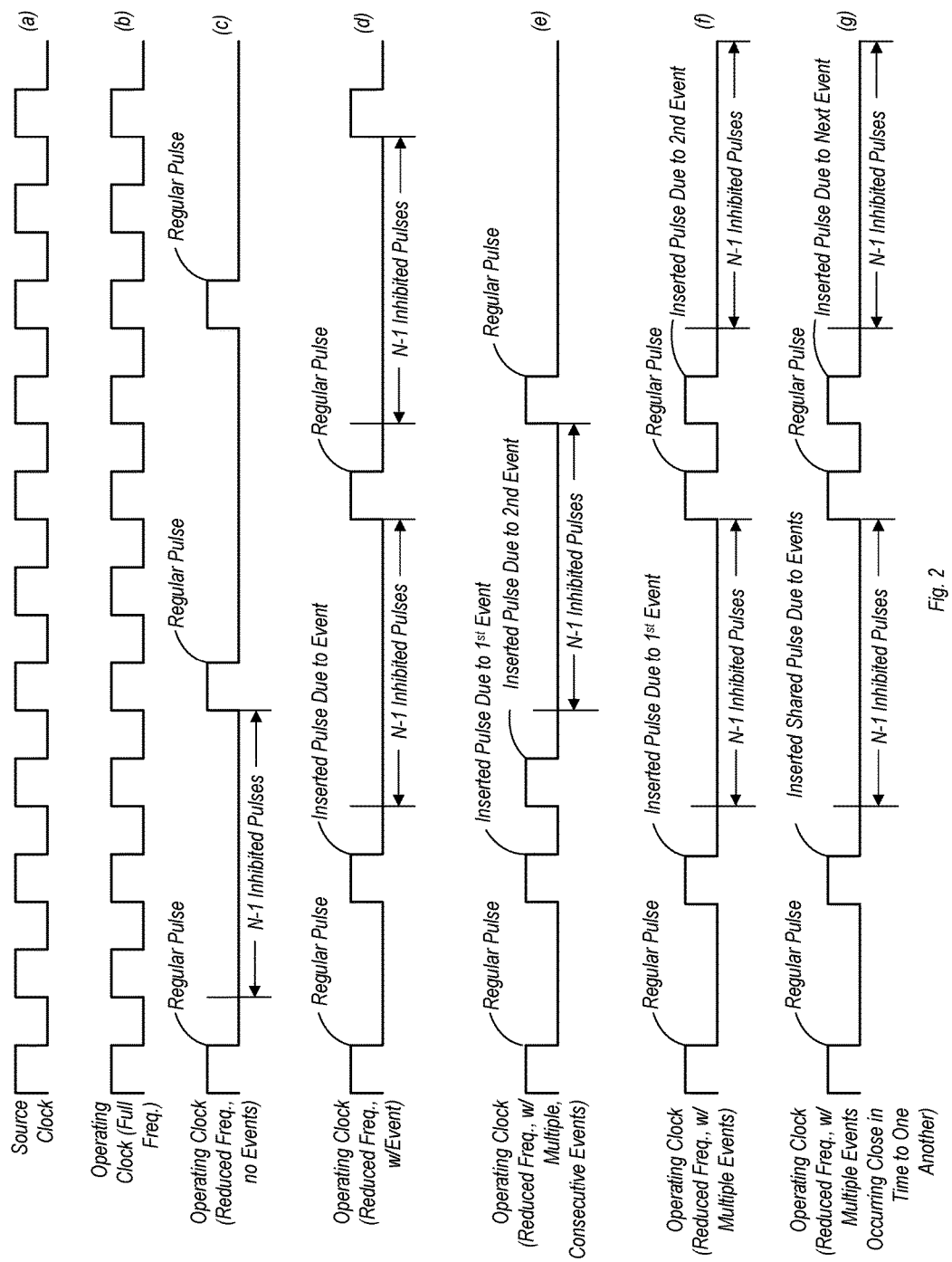
FIG. 2 is a timing diagram illustrating operation of one embodiment of an IC.

FIG. 2 is a timing diagram illustrating operation of one embodiment of an IC arranged in accordance with that shown in FIG. 1. In particular, the timing diagram illustrates a number of different scenarios that may occur during operation of the IC with regard to a particular one of the operating clock signals provided to an FCB 20.

In (a), a waveform for the full frequency source clock signal is shown. This clock signal may operate at the same frequency as long as IC 10 is operating. In (b) the full frequency operating clock signal provided to an FCB 20 is shown. The full frequency operating clock signal is effectively the same signal as the source clock signal, which propagates through the corresponding CGC 13 when its respective enable signal is held asserted.

In (c), a reduced frequency clock signal with no events is shown. An event as defined herein may be a high priority transaction or other incident which causes assertion of an unscheduled operating clock pulse. In this particular example, N=4. Thus, for every four pulses of the source clock signal, only one pulse is allowed to propagate through the corresponding CGC 13 as the operating clock signal. The remaining three pulses (N−1=3) are inhibited. This effectively reduces the frequency of the operating clock signal to ¼ of the frequency of the source clock signal. The one of every four operating clock pulses that propagates in this particular example is referred to here as a regular pulse.

It is noted that N=4 is a single example. The value of N may be different in other embodiments, and may thus be any suitable value. Furthermore, embodiments are possible and contemplated in which multiple values of N may be used for different desired levels of clock frequency reduction.

In (d), an example with a single event and a resulting inserted pulse is shown. In this particular example, after the first scheduled operating clock pulse is provided, the next operating clock pulse is inhibited. However, due to the occurrence of an event, an inserted pulse is inserted, i.e. provided as the operating clock signal to the correspondingly coupled FCB 20. This resets the timing of the regular pulses. After the inserted pulse, the timing is changed (relative to the example in (c)) so that the next regular pulse occurs N−1, or three source clock pulses, after the inserted pulse.

The example shown in (e) shows two events occurring on consecutive clock cycles, and thus two unscheduled operating clock pulses are provide back-to-back. After the second of these unscheduled clock pulses, no further events occur. Accordingly, the next regular pulse of the operating clock signal occurs N−1 cycles of the source clock signal after the second inserted pulse, with N−1 cycles of the operating clock signal being inhibited.

In (f), two events occur at different times, resulting in the providing of corresponding inserted pulses of the operating clock signal. The first event results in an inserted pulse being provided prior to the time the next regular pulse would have been provided in its absence. This resets the timing, and no further events occur thereafter for N−1 cycles of the source clock signal, after which the next regular pulse is asserted. A second event causes assertion of another inserted pulse of the operating clock signal on the cycle immediately following that upon which the regular pulse was asserted. Thereafter, the timing of operation is reset, and no further events occur on the next N−1 cycles of the source clock signal, resulting in a corresponding number of inhibited pulses of the operating clock signal.

In various embodiments, a pulse (scheduled or unscheduled) may be shared. For example, if two events occur at approximately the same time, the next inserted pulse may be shared. This is shown in (g), wherein the first inserted pulse is shared by two events. A FCB 20 in such an embodiment may be able to process two different incoming transactions or events using only a single pulse. In such embodiments, a regular pulse may also be shared. Practically speaking, there may be some delay between the time an event is detected and the time when power management circuit 11 causes a pulse to be output from a clock gating circuit. Thus, if an event occurs at a time that is close enough to the next regular pulse (or if there is insufficient time to insert a pulse), the next regular pulse may be shared, as the corresponding FCB 20 may process both the event and other lower priority transactions responsive thereto. Thus, in such embodiments, power management circuit 11 may include logic to determine whether to allow an inserted pulse to be inserted responsive to an event, or to instead let the event be processed on the next regular pulse.

As noted above, the circuitry in IC 10 is arranged such that the FIFOs 19 provide transactions to their respectively coupled receiving FCB 20 only on regular pulses of the operating clock signal. Accordingly, non-high priority transactions may be delayed in reaching their destination as a result of events that cause the assertion of inserted pulses of the operating clock signal.

Figure 3:
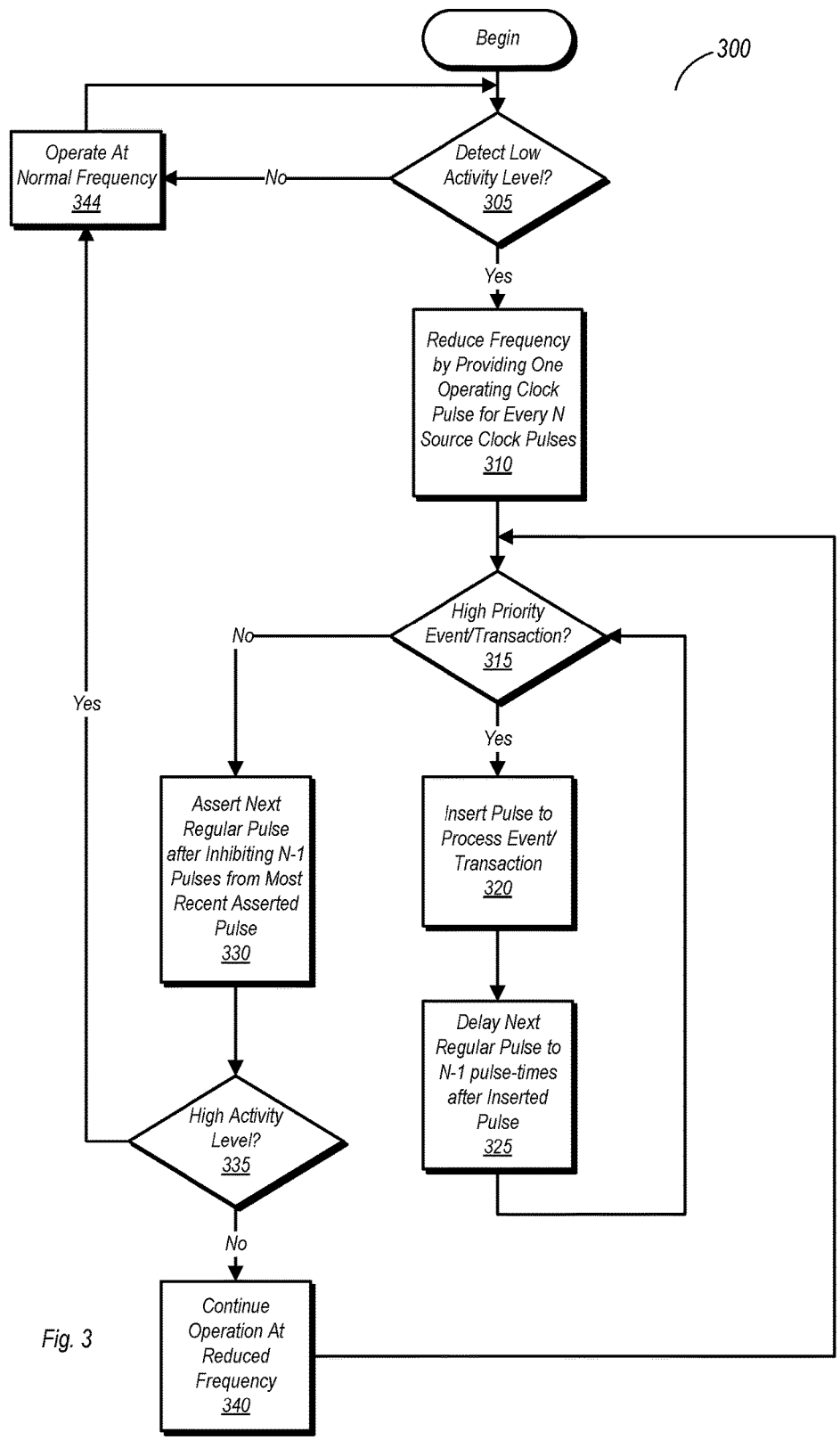
FIG. 3 is a flow diagram illustrating operation of one embodiment of an IC.

FIG. 3 is a flow diagram illustrating operation of one embodiment of an IC. Method 300 may be performed by an embodiment of IC 10 as shown above. It is also possible and contemplated that method 300 may be performed by an apparatus and/or IC embodiment not explicitly discussed herein. It is noted that method 300 is illustrated here with respect to a single functional circuit block. However, it is noted that in various IC and apparatus embodiments, multiple instances of this method may be performed concurrently.

Method 300 begins with a determination of whether a functional circuit block has a low activity level (block 305). The activity level may be defined as low if a metric or some combination of metrics are below a predefined threshold value. If the activity level is not low (block 305, now), the method continues at block 344, with operation occurring at a full clock frequency.

If the activity level is detected as being low (block 305, yes), then the frequency of the clock signal provided to the functional circuit block may be reduced to a value of 1/N (wherein N is an integer value) by allowing only one operating clock pulse to propagate to the functional circuit blow for every N source clock pulses (block 310). This may be accomplished using a clock gating circuit, through manipulation of an enable signal provided thereto. The enable signal may be asserted for one of the N source clock pulses and de-asserted for the remaining N−1 source clock pulses. This results in the clock gating circuit providing one operating clock pulse and inhibiting N−1 operating clock pulses for every N source clock pulses. This effectively reduces the frequency of the operating clock signal to 1/N.

If no high priority transactions occur while operating at the reduced clock frequency (block 315, no), then the next regular pulse of the operating clock signal is asserted after inhibiting N−1 pulses (block 330). If the activity level remains below the threshold level (block 335, no), then operation continues at the reduced clock frequency (block 340). If the activity level exceeds the threshold level (block 335, yes), then operation returns to the normal clock frequency (block 344).

If a high priority event/transaction occurs during operation in the reduced frequency mode (block 315, yes), then an inserted pulse of the operating clock signal is asserted to enable processing of the event/transaction (block 320). Thereafter, the timing of the next regular pulse is reset to occur inhibiting the next N−1 pulse times immediately following the unscheduled operating clock pulse (block 325). The method continues to check for another high priority transaction at block 315, and if none occurs, the next regular pulse is asserted in accordance with block 330.

Figure 4:
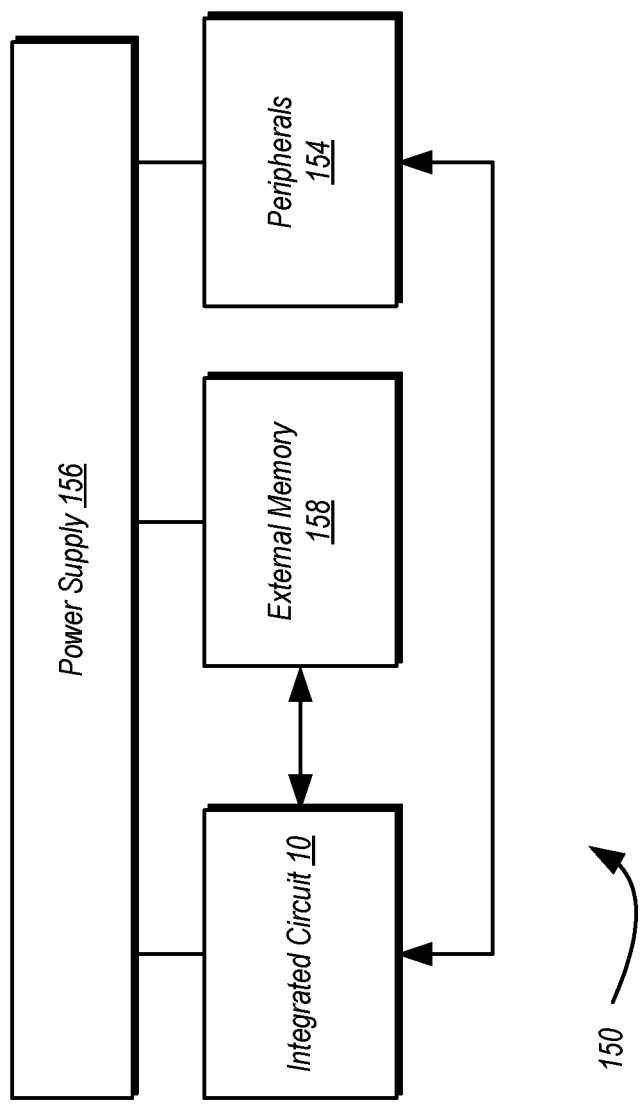
FIG. 4 is a block diagram of one embodiment of an exemplary system.

Turning next to FIG. 4, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a plurality of functional circuit blocks;
   a power management circuit configured to monitor activity levels in at least a subset of the plurality of functional circuit blocks, wherein responsive to determining that an activity level of a given one of the plurality of functional circuit blocks is below a threshold level, the power management circuit is configured to reduce a frequency of a clock signal provided to the functional circuit block by causing, absent any incoming high priority transactions, only one output regular pulse of an operating clock signal to be provided for every N pulses of a corresponding source clock signal;
   wherein the power management circuit is further configured to cause an inserted pulse of the operating clock signal to be provided to the functional circuit block, prior to completion of inhibiting N−1 pulses of the operating clock signal since a previous regular pulse of the operating clock signal, responsive to detecting an incoming high priority transaction to the functional circuit block, and wherein the power management circuit is further configured to, in an absence of a subsequent high priority transaction directed to the functional circuit block within a next N−1 pulses of the source clock signal, inhibit the next N−1 pulses of the operating clock signal immediately following the inserted pulse of the operating clock signal; and
   wherein the power management circuit is configured to allow forward progress of non-high priority transactions only during a regular pulse of the operating clock signal;
   wherein each of the subset of plurality of functional circuit blocks is coupled to receive high priority transactions on a signal path separate from a signal path from which non-high priority transactions are received, wherein high priority transactions are latency critical whereas non-high priority transactions are not latency critical.

2. The apparatus as recited in claim 1, further comprising a clock gating circuit coupled between the power management circuit and the given one of the plurality of functional circuit blocks, wherein the power management circuit is configured, absent any high priority transactions directed to the functional circuit block, to reduce the frequency by causing the clock gating circuit to selectively gate the operating clock signal such that one regular pulse of the operating clock signal is provided for every N clock pulses of the source clock signal provided to the clock gating circuit while inhibiting N−1 pulses of the operating clock signal for every N pulses of the source clock signal.

3. The apparatus as recited in claim 1, further comprising a first-in, first-out memory (FIFO), wherein the FIFO is configured to receive and store incoming transactions directed to the given one of the plurality of functional circuit blocks, wherein each of the transactions stored in the FIFO is a non-high priority transaction.

4. The apparatus as recited in claim 3, wherein the FIFO is configured to output a stored transaction on a regular pulse of the operating clock signal.

5. The apparatus as recited in claim 4, wherein the power management circuit is further configured to inhibit the FIFO from outputting a stored transaction on an inserted pulse of the operating clock signal.

6. The apparatus as recited in claim 1, wherein, responsive to detecting a subsequent high priority transaction directed to the given one of the plurality of functional circuit blocks, the power management circuit is configured to cause another inserted pulse of the operating clock signal to be provided to the given one of the functional circuit blocks irrespective of when a most recent previous inserted pulse of the operating clock signal was provided.

7. The apparatus as recited in claim 1, wherein the power management circuit is configured to determine that an activity level is below a threshold value based on a number of active threads being equal to or less than a predetermined value.

8. The apparatus as recited in claim 1, wherein the power management circuit is configured to determine that an activity level is less than a predetermined threshold value based on detection of one or more transactions initiated by the functional circuit block each having a latency that exceeds a predetermined time.

9. A method comprising:
   detecting, using a power management circuit, that an activity level of a functional circuit block is below a threshold level;
   responsive to detecting that the activity level is below the threshold level, reducing a frequency of a clock signal provided to the functional circuit block by selectively gating a clock signal output from a clock gating circuit such that, absent any incoming high priority transactions, one regular pulse of an operating clock signal is provided for every N clock pulses of a source clock signal provided to the clock gating circuit, and inhibiting N−1 pulses of the operating clock signal for every N pulses of the source clock signal;
   detecting a high priority transaction directed to the functional circuit block via a first signal path;
   providing an inserted pulse of the operating clock signal from the clock gating circuit to the functional circuit block, prior to completion of inhibiting of the N−1 pulses of the operating clock signal since a previous regular pulse of the operating clock signal, responsive to detecting the incoming high priority transaction;

in an absence of a subsequent high priority transaction directed to the functional circuit block within a next N−1 pulses of the source clock signal, inhibiting the next N−1 pulses of the operating clock signal immediately following the inserted pulse of the operating clock signal;

receiving a non-high priority transaction directed to the functional circuit block via a second signal path during a regular pulse of the operating clock signal, the second signal path being separate from the first signal path wherein high priority transactions are latency critical whereas non-high priority transactions are not latency critical.

10. The method as recited in claim 9, further comprising providing, irrespective of when a most recent previous inserted pulse of the operating clock signal was provided, another inserted pulse of the operating clock signal responsive to detecting a subsequent high priority transaction directed to the functional circuit block.

11. The method as recited in claim 9, further comprising storing non-high priority transactions directed to the functional circuit block in a first-in, first-out memory (FIFO).

12. The method as recited in claim 11, further comprising outputting a stored transaction from the FIFO on a regular pulse of the operating clock signal.

13. The method as recited in claim 12, further comprising inhibiting the FIFO from outputting a stored transaction on an inserted pulse of the operating clock signal.

14. An integrated circuit comprising:

one or more functional circuit blocks; and a power management circuit configured to control a frequency of a clock signal provided to each of the one or more functional circuit blocks and further configured to monitor activity levels in each of the one or more functional circuit blocks, wherein:

responsive to determining that an activity level of a given one of the one or more functional circuit blocks is below a threshold level, the power management circuit is configured to reduce a frequency of a clock signal provided to the given one of the functional circuit blocks by selectively gating a clock signal output from a clock gating circuit such that, absent any high priority transactions directed to the given one of the functional circuit blocks, one regular pulse of an operating clock signal is provided for every N clock pulses of a source clock signal provided to the clock gating circuit and inhibit N−1 pulses of the operating clock signal for every N pulses of the source clock signal;

the power management circuit is further configured to cause an inserted pulse of the operating clock signal to be provided to from the clock gating circuit to the given one of the functional circuit blocks, prior to completion of inhibiting the N−1 pulses of the operating clock signal, responsive to detecting an incoming high priority transaction directed to the given one of the functional circuit blocks; and in an absence of a subsequent high priority transaction directed to the functional circuit block within a next N−1 pulses of the source clock signal, inhibit the next N−1 pulses of the operating clock signal immediately following the inserted pulse of the operating clock signal;

wherein each of the one or more functional circuit blocks is coupled to receive high priority transactions via a respective signal path that is separate from a respective signal path upon which non-high priority transaction are received, wherein high priority transactions are latency critical whereas non-high priority transactions are not latency critical.

15. The integrated circuit as recited in claim 14, further comprising a first-in, first-out memory (FIFO), wherein the FIFO is configured to receive and store incoming transactions directed to the given one of the functional circuit blocks, wherein each of the transactions stored in the FIFO is a non-high priority transaction.

16. The integrated circuit as recited in claim 15, wherein the FIFO is configured to output a stored transaction on a regular pulse of the operating clock signal and is further configured to inhibit the FIFO from outputting a stored transaction on an inserted pulse of the operating clock signal.

17. The integrated circuit as recited in claim 14, wherein the power management circuit is configured to determine that an activity level is below a threshold value based on a number of active threads being equal to or less than a predetermined value.

18. The integrated circuit as recited in claim 14, wherein the power management circuit is configured to determine that an activity level is less than a predetermined threshold value based on detection of one or more transactions initiated by the functional circuit block each having a latency that exceeds a predetermined time.

* * * * *